United States Patent
Jasuja et al.

(10) Patent No.: US 6,766,206 B1
(45) Date of Patent: Jul. 20, 2004

(54) SYSTEM AND METHOD FOR DESIGNING AUTOMOTIVE STRUCTURE USING ADHESIVES

(75) Inventors: Subhash C. Jasuja, Novi, MI (US); Harihar T. Kulkarni, Canton, MI (US); Paul E. Geck, Milford, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 806 days.

(21) Appl. No.: 09/625,594

(22) Filed: Jul. 26, 2000

(51) Int. Cl.[7] .............................................. G06F 19/00
(52) U.S. Cl. .................................. 700/98; 703/1; 703/2
(58) Field of Search .......................... 700/97, 98, 182; 703/1, 8

(56) References Cited

U.S. PATENT DOCUMENTS

| | | | | |
|---|---|---|---|---|
| 5,544,458 A | * | 8/1996 | Fisher et al. .......... | 52/204.591 |
| 5,555,406 A | * | 9/1996 | Nozawa ................... | 703/1 |
| 5,729,463 A | * | 3/1998 | Koenig et al. ........... | 700/98 |
| 6,081,654 A | * | 6/2000 | Morman et al. ......... | 703/1 |
| 6,186,011 B1 | * | 2/2001 | Wung et al. ............. | 73/850 |

* cited by examiner

Primary Examiner—Albert W. Paladini
Assistant Examiner—Douglas S. Lee
(74) Attorney, Agent, or Firm—Brooks Kushman, P.C.; Damian Porcari

(57) ABSTRACT

A system and method for designing an automotive body structure. A CAE system 14 receives certain programmable parameters or user input data 12, and generates a computer model of a body structure 16 which is analyzed and optimized in order to minimize the weight of the body structure 16 by use of adhesive bond technology.

16 Claims, 3 Drawing Sheets

SYSTEM AND METHOD FOR DESIGNING AUTOMOTIVE STRUCTURE USING ADHESIVES

FIELD OF THE INVENTION

This invention relates to a system and a method for designing a structure and more particularly, to a system and a method for designing an automotive body structure which provides enhanced stiffness and weight reduction by optimizing the application of adhesive bond technology throughout the body structure.

BACKGROUND OF THE INVENTION

Structures, such as automotive vehicle body structures, often include a multitude of components or members which are selectively coupled together to form the respective structure. For example and without limitation, automotive body structures typically include numerous panels, supports, rails, members and other structures which are selectively and operatively joined or attached to each other to cooperatively form a vehicle body. Such automotive body structures are typically designed and/or formed to comply with various stiffness, strength and/or performance requirements or criteria.

Many prior automotive body structures utilize primarily conventional welding processes and procedures to operatively join or attach the various portions of the structures together. However, it has been found that the selective use of adhesive bond technology in the formation of an automotive body structure may allow the body structure to be formed having a reduced overall weight (e.g., by using lighter gage metal portions or components), while still satisfying stiffness and strength requirements. Although the selective use of adhesives may provide the foregoing benefits, the locations in which the adhesives should be applied to provide these benefits is often difficult to ascertain.

Formerly, the use and/or location of use of adhesives in an automotive body structure was typically determined on a "trial and error" basis. For instance, an automotive body designer would construct a body structure using adhesives in one or more locations in the body. The resulting body was then tested, and a new body was constructed based upon the results of the test using lighter gage metal for certain structures, panels and/or components of the body. Depending on the test results (e.g., the stiffness and performance of the resulting body), the new body would include adhesive bonds in fewer, additional or different locations, as well as heavier or lighter structures, panels and/or components. The new body was then tested and the foregoing process was repeated until a satisfactory design was achieved. This "trial and error" type design strategy undesirably increases the time and expense required to design and develop automotive body structures and components, thereby decreasing the efficiency and flexibility of the design process.

There is therefore a need to provide a system and a method for designing an automotive body structure which overcomes at least some of the various and previously delineated drawbacks of prior methods and strategies, and which provides a body structure having improved stiffness and reduced weight by optimizing the use of adhesive bond technology within the body structure.

SUMMARY OF THE INVENTION

It is a first object of the invention to provide a system and a method for designing a structure which overcomes at least some of the previously delineated drawbacks of prior design methods.

It is a second object of the invention to provide a system and a method for designing an automotive body structure which allows the structure to be relatively quickly and easily generated.

It is a third object of the invention to provide a system and a method for designing an automotive body structure which has improved stiffness and reduced weight relative to prior body structures.

It is a fourth object of the invention to provide a system and a method for designing an automotive body structure which optimizes the use of adhesive bond technology within the body structure.

According to a first aspect of the present invention, a system for designing a body structure is provided. The body structure is of the type which is formed by a plurality of members (e.g., body panels) which are selectively interconnected by a plurality of first joints (e.g., adhesive joints) and second joints (e.g., welded joints). The system includes: a first portion which selectively receives first data which describes attributes of the plurality of members and second data which describes attributes of the plurality of first and second joints; a second portion which generates a model of the body structure based on the first and second data; a third portion which receives third data corresponding to operating loads and which simulates the operating loads being imparted upon the body structure; and a fourth portion which records certain performance characteristics of the body structure which are measured when the model is exposed to the simulated operating loads.

According to a second aspect of the present invention, a method is provided for designing a body structure having a plurality of seams (or flanges). The method includes the steps of generating a first computer model of the body structure in which each of the plurality of seams is adhesively bonded; performing a simulated test of the computer model of the body structure; analyzing results of the simulated test; ranking each of the adhesively bonded seams based upon a contribution to body stiffness; selecting a combination of adhesively bonded seams based upon the ranking; generating a second computer model of the body structure having a selective combination of adhesively bonded seams; and analyzing the second computer model to determine whether the second computer model satisfies certain cost and performance requirements.

These and other objects, aspects, features, and advantages of the present invention will become apparent from a consideration of the following specification and the attached drawings.

DETAILED DESCRIPTION OF THE PREFERRED EMBODIMENT OF THE INVENTION

Figure 1:
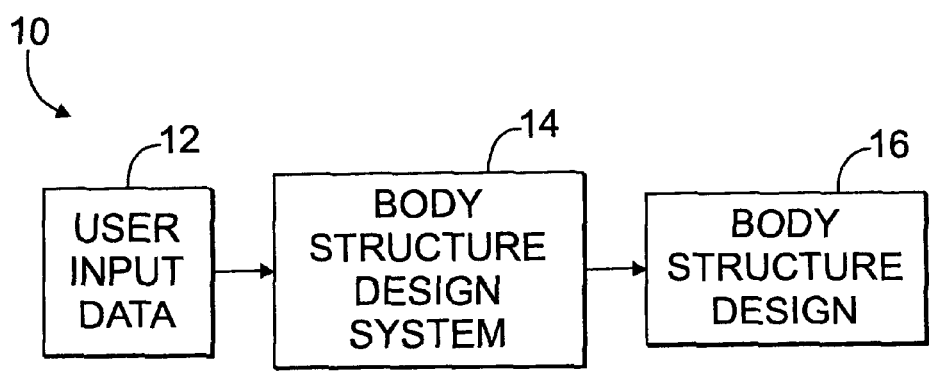
FIG. 1 is a block diagram illustrating the broad functionality of a system for designing a body structure which is made in accordance with the teachings of a preferred embodiment of the present invention.

Referring now to FIG. 1, there is shown a block diagram 10 illustrating the broad functionality of a body structure design system 14 which is made according to the teachings of the preferred embodiment of the present invention and which is adapted to create or generate an automotive body structure design 16. In the preferred embodiment of the invention, body structure 16 corresponds to a conventional vehicle body and/or frame structure which is typically designed in accordance with certain "stiffness", strength and/or weight requirements or criteria. While the use of system 14 is discussed in reference to the creation and/or generation of a vehicle body structure 16, it should be realized that in other alternate embodiments, system 14 can be used to design and/or generate other types of components, structures or objects.

In the preferred embodiment, system 14 is a conventional computer aided engineering system ("CAE system") that may be executed or run using a memory unit and one or more microprocessors which cooperatively perform the below-described calculations, functions, designs and other processes. In the preferred embodiment of the invention, CAE system 14 uses both permanent and temporary memory, and is adapted to selectively store data or information, including information associated with the operation of the preferred embodiment of the invention, processing data, mathematical and geometric relationships and equations, constants, design criteria and other data, which are used by CAE system 14 to generate a body structure design 16.

CAE system 14 may further utilize a conventional user interface or input device (e.g., a keyboard, mouse, disk drive, modem or other data inputting apparatus), which allows CAE system 14 to receive certain user input data 12 which may comprise various programmable parameters and variable values.

The programmable parameters or variable values (i.e., the user input data) control and/or determine the shape, stiffness, and weight of the body structure design and may be based upon various design criteria. These programmable parameters and variable values may describe, for example and without limitation: the shape, geometry, size and gage of body panels, members and other structures which cooperatively form the body structure; the location of adhesive bond material within the body structure (e.g., the portions of the body structure which are joined by use of adhesive bond material); the location and type of welds which are used within the body structure; and the shape and geometry of the body structure. User input data 12 may be selectively entered or modified by a user through a conventional user interface, or may be set to certain default values that are stored within the memory of the CAE system 14. As explained more fully below, CAE system 14 receives user input data 12 and generates a computer model of a body structure 16 based upon the values of the entered data.

Figure 2:
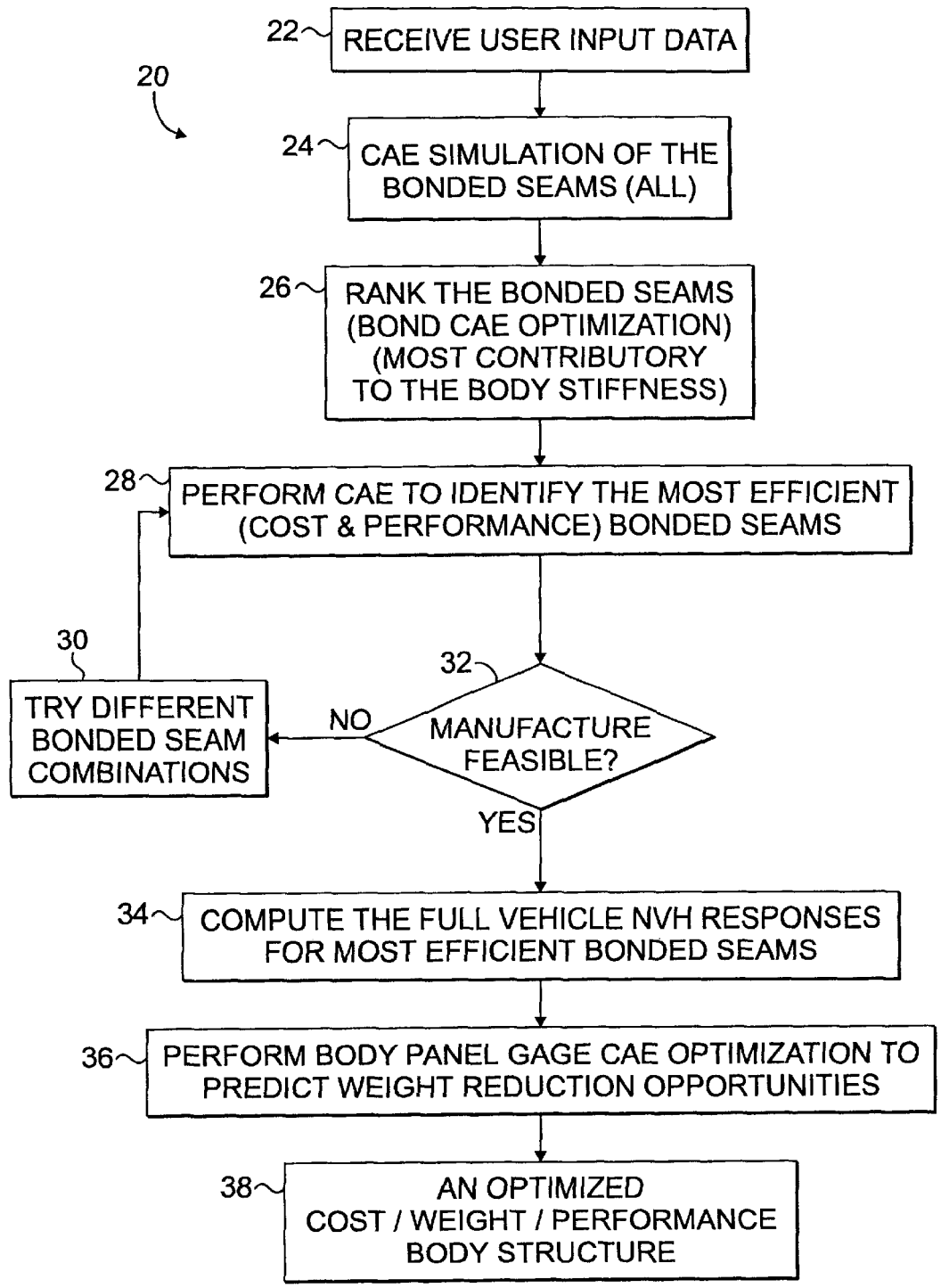
FIG. 2 is a block diagram illustrating a method for designing a body structure which is followed in accordance with the teachings of a preferred embodiment of the present invention.

In order to more fully understand the operation of system 14, the following discussion will describe the method or procedure 20 for creating an automotive body structure which is performed in accordance with the teachings of the preferred embodiment of the invention, and which is shown in FIG. 2. The method 20 uses system 14 to create a simulated body structure design or model 16 using several independently programmable and/or modifiable "building blocks", body panels, segments, members or portions which are linked or connected together in a cooperative manner by several joints (e.g., welds and/or adhesive bonds) to form the desired body structure.

Figure 3:
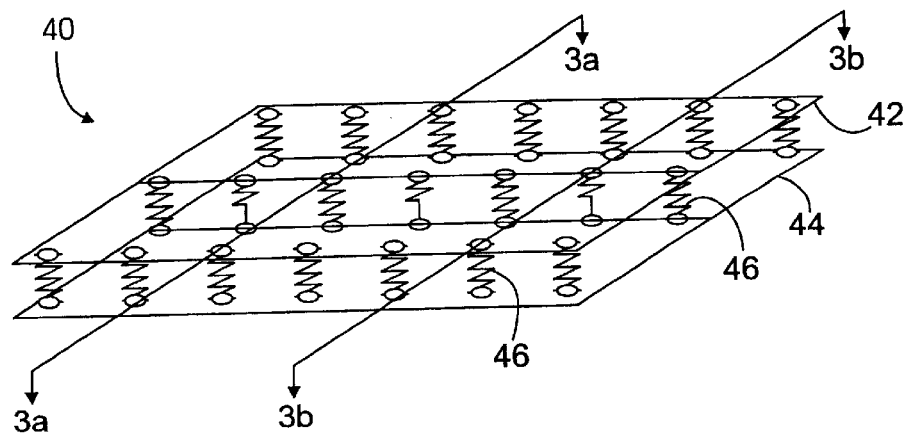
FIG. 3 is portion of a computer model illustrating a simulation of the adhesive bonding of the body structure which is generated by the method shown in FIG. 2.
Figure 3A:
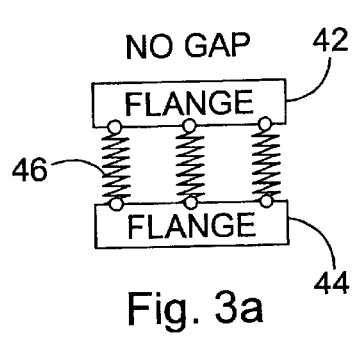
FIG. 3a is a cross-section of the computer model shown in FIG. 3, illustrating portions of the body structure in which the mating seams are disposed directly adjacent to each other.
Figure 3B:
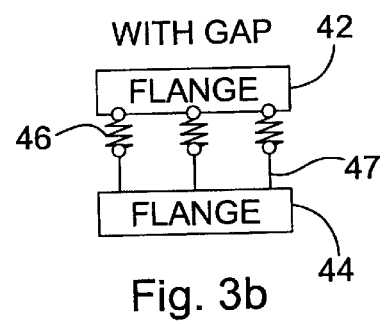
FIG. 3b is a cross-section of the computer model shown in FIG. 3, illustrating portions of the body structure in which the mating seams are separated by a gap.
Figure 4:
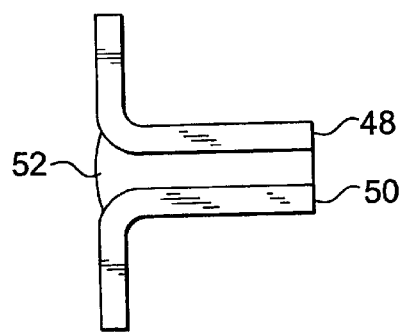
FIG. 4 is a side view of a portion of the body structure which is modeled in FIG. 3.

A portion 40 of a generated computer model of a body structure is illustrated in FIGS. 3, 3a and 3b. A side view of a portion of the body structure that is modeled in FIGS. 3, 3a and 3b is shown in FIG. 4. As shown in FIG. 4, the body structure includes two panels, portions or members 48, 50 which are coupled together by an amount of adhesive 52. The computer model of the body structure 40 includes two structural members, panels or portions 42, 44, which respectively represent members 48, 50, and springs 46 which represent the adhesive material and/or joints 52 that bond members 48, 50 together. The attributes or characteristics of portions 42, 44 are determined by the size, shape, and gage of the respective panels or members that they represent. The attributes or characteristics of the springs 46 (e.g., the location, size, and spring constant) are determined by the type of seam or joint that spring 46 represents (e.g., a coach, half-coach or lap joint) and the location, size and/or type of adhesive used to form the joint. In the preferred embodiment of the invention, the spring rates or constants are computed by the following expressions:

$$K(\text{stiffness rate}) = E * A / t \qquad (\text{Eq. 1})$$

and $$K(\text{shear}) = (5/6) * G * A / t \qquad (\text{Eq. 2})$$

where "E" is equal to the "Young's modulus" of the adhesive material; "A" is equal to the bond contact area; "t" is equal to the bond thickness; and "G" is equal to the "bulk modulus" of the adhesive material. If the mating members or portions 48, 50 are disposed directly "on top" of each other (i.e., where there is substantially no gap between the mating flanges or portions), the spring elements 46 are of "zero length", as shown in FIG. 3a. If the mating members or portions 48, 50 are separated by a gap, the gap is filled by rigid elements 47 and then spring elements 46 of zero length are created, as shown in FIG. 3b. It should be appreciated that by connecting several structural portions, panels or members 42, 44, a body structure of virtually any shape and size may be selectively formed.

Method 20 begins with step 22 by receiving user input data 12. A user enters parameters and variables that correspond to the characteristics and attributes of the various portions of the vehicle body structure. Specifically, a user enters information such as data corresponding to the gage, shape, and size of the panels and other members that cooperatively form the body structure; data corresponding to the geometry of the body structure; data corresponding to the location and type of adhesive used to join portions of the body structure; and data corresponding to the location and type of welds used to join portions of the body structure.

CAE system 14 receives or accepts the selectively entered parameter values and/or retrieves stored or default values from within its memory (e.g., if certain parameters are not entered, CAE system 14 will retrieve default parameter values which are stored within its memory and will generate the body structure design by use of these default values and the selectively entered values).

In step 24, CAE system 14 simulates a body structure having adhesive bonds between all of the mating seams and/or joints and generates the simulated vehicle body structure (i.e., a computer model of the body structure). The stiffness rates "K" are computed for every element, joint or bond and are combined at each node point, based upon each elemental contribution. In the preferred embodiment, the simulation includes a visual representation that depicts the body structure that is being simulated. The visual representation is formed in a conventional manner using computer aided design ("CAD") software and/or any other computer software that can produce a visual representation based on values received by the software. The visual representation shows the body structure as formed according to the user-selected parameters and variables.

Once a design or computer model of the body structure has been formed having adhesive bonds at all seams, a user proceeds to functional block or step 26. In step 26, the fully bonded body is analyzed for its static performance (e.g., bending and torsion stiffness) and its dynamic performance (e.g., natural frequencies). Then, a bond CAE optimization is performed, which ranks the each of the bonded seams based on their contribution to the body stiffness (i.e., both static and dynamic performance).

Once all of the bonded seams and/or joints have been ranked, several CAE experiments are performed on the model in steps 28, 30 and 32. Particularly, using the CAE system 14, a user forms a body structure model having various combinations of the previously ranked seams and/or joints, and observes the performance of the respective model (e.g., by performing a simulation of the model). If the model provides satisfactory performance, manufacturing cost estimates are developed and the manufacturability is investigated, in step 32, where a user determines whether the suggested combination is feasible from a cost and manufacturing viewpoint. If the adhesive bond seam combination used to form the model is not feasible due to cost and/or manufacturing considerations (e.g., the combination(s) would undesirably and significantly increase the cost and/or complexity for manufacture), different bonded seam combinations are used to generate a new body structure model. The new model is subsequently evaluated in step 28.

Once a functionally and/or structurally acceptable body structure is generated that meets cost and manufacturing feasibility considerations, a user proceeds to step 34. In step 34, the body structure having the desired combination of adhesive bond joints and/or seams is subjected to a full vehicle CAE analysis. Particularly, an analysis is performed on the full vehicle system model to compute stiffness and noise vibration harshness "NVH" responses, such as subjective NVH ratings, seat track vibrations and other measurable attributes. The body structure model is subjected to various operating loads that correspond to loads that would be experienced during the normal operation of a vehicle (e.g., forces generated and/or imparted on the body structure during the operation of the vehicle). The CAE system 14 records loads, sag, movement, and other conventional performance measurements in various locations on the body structure when it is exposed to the operating loads, and displays the recorded data to a user in a conventional manner. In step 34, the results of the simulated operation of the vehicle are analyzed. Particularly, stiffness, NVH, and/or other conventional performance characteristics or measurements of the body structure are analyzed to determine whether the generated structure satisfies industry standards or other desired requirements. Based upon the analysis performed in step 34, a user attempts to optimize the design in step 36.

For example and without limitation, a user will attempt to lower the weight of the body structure by using lower gage material for certain panels or members of the body structure, while continuing to ensure that the resulting body structure meets certain baseline performance requirements. The new lighter gage portions, elements and/or components are reviewed to ensure that they meet manufacturing feasibility requirements (e.g., stamping or oil canning requirements) as well as safety, durability and NVH requirements. Additionally, a user may also attempt to increase the stiffness of certain portions of the body structure which did not meet or satisfy required performance criteria. If alterations are made to "optimize" the body structure, a new computer model of the structure may be generated and tested. Furthermore, step 36 may be repeated until the body structure can no longer be optimized (i.e., when any further reduction in the gage of the panels or members of the body structure will cause the structure to fail certain performance or stiffness requirements).

Once the body structure has been fully "optimized", the body structure will employ minimum gage values for the panels and members of the structure, and the use of adhesive within the body structure will substantially meet the primary cost, manufacturing and performance objectives. Hence, the "optimized" structure, shown in block 38, will have a minimum weight, while continuing to satisfy the desired stiffness and performance criteria.

Once the "optimized" body structure is generated, an actual prototype or working model of the body structure may be built according to the attributes and characteristics of the computer model. The prototype or working model then can be tested under actual conditions to ensure that all performance criteria are satisfied.

It should be recognized that the foregoing system and method allows an individual to relatively quickly design a body structure having a minimum weight and optimized amounts and placement of adhesive within the body structure. The simulation provided by the system and method allows an individual to optimize the body structure without wasteful experiments using actual components and materials, and thereby minimizes the cost and time required to design a body structure.

It is to be understood that the present invention is not limited to the exact construction or method which has been previously delineated, but that various changes and modifications may be made without departing from the spirit and scope of the invention as are more fully delineated in the following claims.

What is claimed is:

1. A system for creating a model of a body structure of the type which is formed by a plurality of members which are selectively interconnected by a plurality of first and second joints, said system comprising:

an input component selected from the group consisting of a user interface and input device, the input component selectively receiving first data which describes attributes of said plurality of members and second data which describes attributes of said plurality of first and second joints;

a CAE system which:
generates said model of said body structure based on said first and second data,
receives third data corresponding to operating loads,
simulates said operating loads being imparted upon said body structure by use of said model; and
records certain performance characteristics of said body structure which are measured when said model of body structure is exposed to said simulated operating loads.

2. The system of claim 1 wherein said plurality of members comprise vehicle body panels.

3. The system of claim 2 wherein said first joints comprise adhesive joints.

4. The system of claim 3 wherein said second joints comprise welded joints.

5. The system of claim 4 wherein said attributes of said plurality of members include a gage, shape and size of each of said plurality of members.

6. The system of claim 5 wherein said attributes of said plurality of first and second joints include a location and type of each of said plurality of first and second joints.

7. The system of claim 6 wherein each of said plurality of first and second joints is modeled as a spring.

8. A method for designing a body structure having a plurality of seams, said method comprising the steps of:

generating a first computer model of said body structure in which each of said plurality of seams is adhesively bonded;

performing a simulated test of said first computer model of said body structure;

analyzing results of said simulated test;

ranking each of said adhesively bonded seams based upon a contribution to body stiffness;

selecting a combination of adhesively bonded seams based upon said ranking;

generating a second computer model of said body structure having said combination of adhesively bonded seams; and analyzing said second computer model to determine whether said second computer model of said body structure satisfies certain cost and performance requirements.

9. The method of claim 8 further comprising the step of:

determining whether said second computer model of said body structure is feasible to manufacture.

10. The method of claim 9 further comprising the steps of:

if said second computer model of said body structure is not feasible to manufacture, selecting a second combination of adhesively bonded seams based upon said ranking;

generating a third computer model of said body structure having said second combination of adhesively bonded seams; and analyzing said third computer model to determine whether said third computer model satisfies certain cost and performance requirements.

11. The method of claim 10 wherein said body structure comprises a vehicle body structure.

12. The method of claim 11 further comprising the steps of:

if said second computer model of said body structure is feasible to manufacture, performing a full vehicle computer analysis of said second computer model; and optimizing said second computer model of said body structure based upon said complete functional computer analysis, said optimized body structure having a reduced weight.

13. The method of claim 12 wherein said body structure further comprises a plurality of members which are interconnected by said plurality of seams and which each has a unique gage, and wherein the step of optimizing said body structure comprises reducing the gage of at least one of said plurality of members.

14. The method of claim 13 wherein the steps of generating said first and second computer model and performing said full vehicle analysis are performed by use of a computer aided engineering system.

15. A method for designing an automotive body structure having a plurality of members which are interconnected by a plurality of seams, said method comprising the steps of:

receiving data describing attributes of said plurality of members and said plurality of seams;

generating a first computer model of said body structure based upon said received data, said first computer model having adhesive bonds at each of said plurality of seams;

performing a simulation of said first computer model of said body structure;

ranking each of said adhesively bonded seams based upon a contribution to static body performance and dynamic body performance;

selecting a combination of adhesively bonded seams based upon said ranking;

generating a second computer model of said body structure having said combination of adhesively bonded seams;

performing a simulation of said second computer model to ensure that said generated second computer model satisfies certain performance requirements;

determining whether said second computer model of said body structure is feasible from a manufacturing and cost viewpoint;

if said second computer model of said body structure is not feasible from a manufacturing and cost viewpoint, selecting a second combination of adhesively bonded seams based upon said ranking;

generating a third computer model of said body structure having said second combination of adhesively bonded seams;

performing a simulation of said third computer model of said body structure to ensure that said third computer model satisfies certain performance requirements; and determining whether said third computer model of said body structure is feasible from a manufacturing and cost viewpoint;

if said second computer model of said body structure is feasible from a manufacturing and cost viewpoint, performing a full vehicle computer analysis of said second computer model of said body structure; and optimizing said second computer model of said body structure based upon said complete functional computer analysis, said optimized body structure having a reduced weight.

16. The method of claim 15 wherein the steps of generating said first and second computer model and performing said full vehicle analysis are performed by use of a computer aided engineering system.

* * * * *